United States Patent
Ohya

(10) Patent No.: US 6,229,339 B1
(45) Date of Patent: May 8, 2001

(54) CIRCUIT FOR DRIVING SWITCHING ELEMENT

(75) Inventor: Tetsuji Ohya, Aichi (JP)

(73) Assignee: Kabushiki Kaisha Toyoda Jidoshokki Seisakusho, Kariya (JP)

(*) Notice: Subject to any disclaimer, the term of this patent is extended or adjusted under 35 U.S.C. 154(b) by 0 days.

(21) Appl. No.: 09/275,150

(22) Filed: Mar. 24, 1999

(30) Foreign Application Priority Data

Mar. 27, 1998 (JP) .................................................. 10-081638

(51) Int. Cl.⁷ .............................................. H03K 19/0175

(52) U.S. Cl. ..................................... 326/83; 84/89; 84/88

(58) Field of Search .................................. 326/82, 83, 86, 326/88, 90, 92, 84

(56) References Cited

U.S. PATENT DOCUMENTS

| | | | |
|---|---|---|---|
| 4,587,447 | * | 5/1986 | Baehring ................................ 326/88 |
| 4,855,622 | * | 8/1989 | Johnson ................................. 326/92 |
| 5,008,568 | * | 4/1991 | Leung et al. .......................... 326/88 |
| 5,404,051 | * | 4/1995 | Kobayashi ............................ 327/170 |

* cited by examiner

*Primary Examiner*—Michael Tokar
*Assistant Examiner*—Don Phu Le
(74) *Attorney, Agent, or Firm*—Woodcock Washburn Kurtz Mackiewicz & Norris LLP

(57) ABSTRACT

A first MOS transistor and a second MOS transistor are interconnected in series. Basically, a set of these MOS transistors are alternately turned on according to a switching signal. The collector of a third transistor is connected to the gate of the second MOS transistor. A capacitor is provided between the base of the third transistor and the connection point between the first MOS transistor and the second MOS transistor.

3 Claims, 5 Drawing Sheets

(OPERATION OF THE PRIOR ART)

(OPERATION OF THE PRESENT EMBODIMENT)

CIRCUIT FOR DRIVING SWITCHING ELEMENT

BACKGROUND OF THE INVENTION

1. Field of the Invention

The present invention relates to a circuit for driving a switching element, and more specifically to a circuit for driving a set of interconnected switching elements.

2. Description of the Related Art

Conventionally, there has been a circuit for driving a set of interconnected switching elements alternately, and providing an electric current for a load connected to the connection point between the elements. This type of circuit is used as a power supply circuit for a DC/DC converter, inverter, etc., or an H bridge circuit for driving a motor, etc.

FIG. 1 shows an example of the configuration of a set of interconnected switching elements and the driving circuit thereof. In this example, the conventional driving circuit is applied to a DC/DC converter.

A MOS transistor 1 and a MOS transistor 2 are interconnected in series. An input voltage Vin is applied to the MOS transistor 1, and the MOS transistor 2 is grounded. An inductor and, through the inductor, an output capacitor are connected to the connection point (point Lx) between the MOS transistor 1 and the MOS transistor 2.

The drive circuit of the MOS transistor 1 includes transistors Q1 through Q4 and transistors M1 through M4. The drive circuit of the MOS transistor 2 includes transistors Q5 through Q8 and transistors M5 through M8. These two driving circuits have the same configurations. The transistors Q1, Q2, M3, and M4 are circuits for turning on the MOS transistor 1 and holding an ON state thereof. The transistors Q3, Q4, M1, and M2 are circuits for turning off the MOS transistor 1 and holding an OFF state thereof. These also hold true with the MOS transistor 2.

Switching signals S and $\overline{S}$ are signals for controlling the MOS transistor 1 and the MOS transistor 2 respectively, and are basically in inverse states to each other. Therefore, according to these signals the MOS transistor 1 and the MOS transistor 2 are alternately set in the ON state.

Briefly described below is the operation of the circuit for driving the MOS transistor 1. When an 'H' is input as a switching signal S, the transistor Q1 is set in the OFF state, and the transistor M1 enters the ON state, thereby setting the transistor Q2 in the OFF state. Therefore, no current is applied to the gate of the MOS transistor 1. When an 'H' is input as a switching signal S, the transistors M2 and M3 enter the ON state and the OFF state respectively. As a result, the transistor Q3 is set in the ON state and the transistor M4 enters the OFF state, thereby setting the transistor Q4 in the ON state. Therefore, an electric charge is removed from the gate of the MOS transistor 1 by an electric current flowing through the transistor Q4. As a result, the MOS transistor 1 maintains its OFF state.

On the other hand, when an 'L' is input as a switching signal S, the transistors Q1 and Q2 are set in the ON state, thereby applying an electric current to the gate of the MOS transistor 1, and simultaneously setting the transistors Q3 and Q4 in the OFF state. As a result, the MOS transistor 1 is set in the ON state.

The operation of the circuit for driving the MOS transistor 2 is the same as the operation of the circuit for driving the MOS transistor 1. Therefore, when inverse states are inputs as switching signals S and $\overline{S}$, the MOS transistor 1 and the MOS transistor 2 are alternately driven in the ON state.

As described above, the MOS transistor 1 and the MOS transistor 2 are basically turned on alternately. If these two transistors are simultaneously set in the ON state, then the power supply (input voltage Vin) and the ground are substantially short-circuited. When such a short-circuit occurs, the MOS transistor 1 and the MOS transistor 2 can be destroyed by an overcurrent. Therefore, a dead time is provided to avoid such a short-circuit so that the MOS transistor 1 and the MOS transistor 2 cannot simultaneously enter the ON state. For example, immediately before the MOS transistor 1 is turned on, the MOS transistor 2 is turned off.

When the MOS transistor 1 is turned on with the configuration including the dead-time, the electric potential at a point Lx suddenly rises because the MOS transistor 2 has already been turned off. As well-known by one of ordinary skill in the art, a parasitic capacitance exists between the drain and the gate of MOS transistor. Therefore, if the electric potential at the point Lx suddenly rises when the MOS transistor 1 is turned on, then the parasitic capacitance makes the potential rise also at the gate of the MOS transistor 2. At this time, if the potential between the gate and the source of the MOS transistor 2 exceeds a threshold voltage, then the MOS transistor 2 is turned on. That is, in this case, the MOS transistor 2 is turned on although the switching signal $\overline{S}$ indicates 'OFF'. Such a phenomenon can be referred to as an "erroneous turning-on".

When the above described erroneous turning-on occurs in the MOS transistor 2 with the MOS transistor 1 already set in the ON state, these two transistors are simultaneously set in the ON state. This state terminates when the MOS transistor 2 is turned off in the following operation.

(1) The voltage between the gate and the source of the transistor M6 exceeds the threshold when the electric potential rises at the point VL.

(2) The transistor M6 is set in the ON state after the step (1) above.

(3) The transistor Q7 is set in the ON state after the step (2) above.

(4) A base current is applied to the transistor Q8 after the step (3) above, and the transistor Q8 is turned on.

(5) An electric charge is removed from the gate of the MOS transistor 2 after the step (4) above, and the MOS transistor 2 is turned off.

The operations in the steps (1) through (5) above require some time. In addition, when the threshold of the transistor M6 is large, the transistor M6 cannot be easily turned on depending on when the potential rises at the point $V_L$. In this case, the MOS transistor 2 keeps the ON state for a relatively long time.

As described above, in the conventional driving circuit, if one of a set of interconnected switching elements is turned on, an erroneous turning-on arises at the other switching element, and a set of switching elements simultaneously enter the ON state, then the circuit cannot exit the state within a short time, or cannot exit the state. Such a state not only keeps the operation of the circuit (load) in an instable state, but also may lead the switching element itself into destruction.

SUMMARY OF THE INVENTION

The present invention aims at preventing an erroneous turning-on of a set of interconnected switching elements, or reducing the influence of the erroneous turning-on.

The driving circuit according to the present invention is based on the configuration for driving the first and second interconnected switching elements. The circuit includes an electric charge removing unit, connected to the control terminal of the first switching element, for removing an electric charge from the control terminal of the first switching element according to the control signal; and a capacitor connected between the electric charge removing unit and the connection point between the first and second switching elements. The electric charge removing unit removes the electric charge from the control terminal of the first switching element according to the signal input through the capacitor.

With the above described configuration, if an electric potential at the connection point between the first and second switching elements changes when the second switching element is switched, then a signal indicating the change is input to the above described electric charge removing unit through the capacitor.

The electric charge removing unit removes the electric charge from the control terminal of the first switching element according to the signal through the capacitor. Thus, the first switching element is forcibly turned off.

According to the present invention, 'interconnected' indicates a state of two switching elements not only directly connected, but also electrically coupled to each other.

With the above described configuration, the electric charge removing unit can be realized by a transistor. In this case, the capacitor is connected to the control terminal of the transistor.

DETAILED DESCRIPTION OF THE INVENTION

The embodiments of the present invention are described below by referring to the attached drawings.

Figure 2:
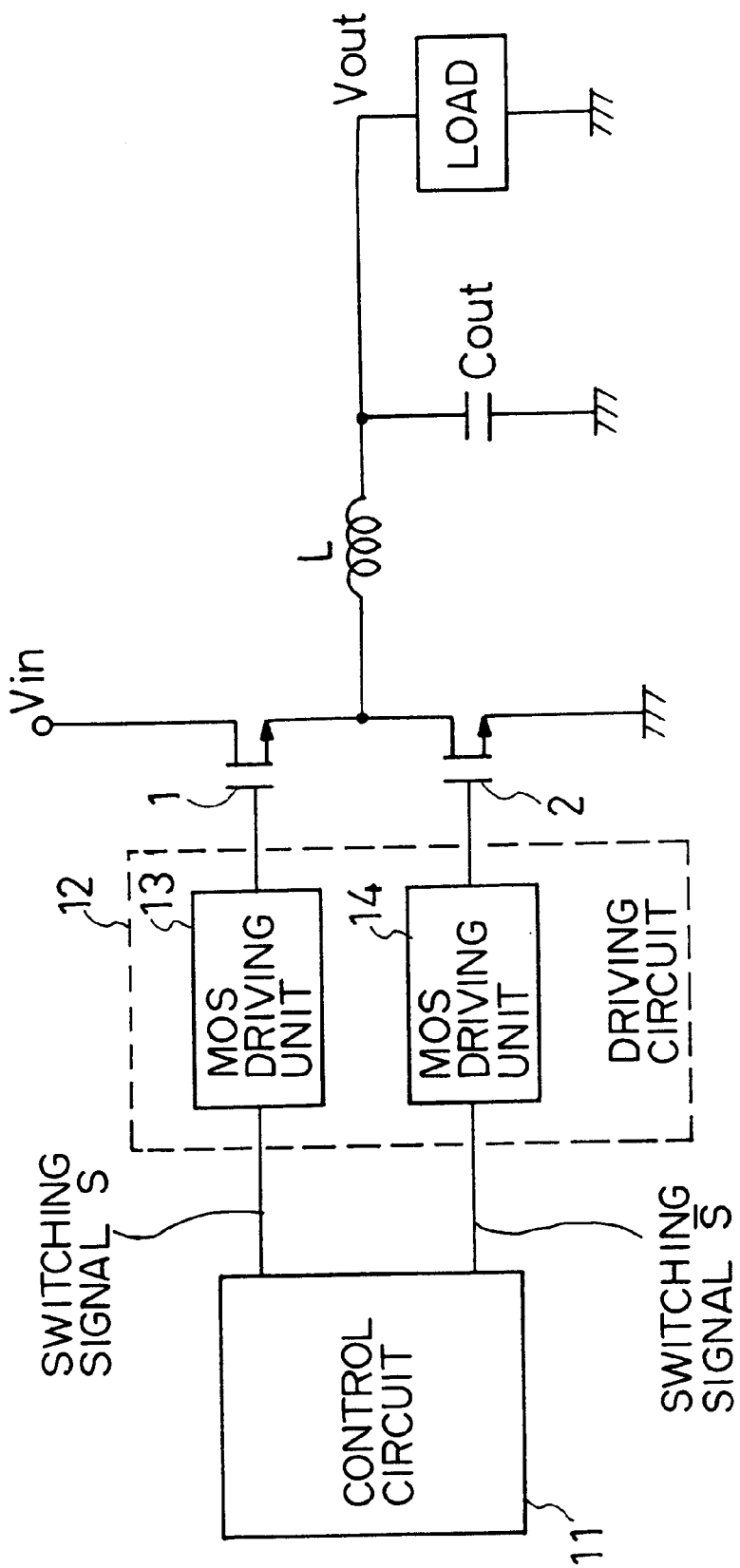
FIG. 2 shows the configuration of an application example of the driving circuit according to the present embodiment.

FIG. 2 shows the configuration of an application example of a driving circuit according to the present embodiment. In this example, the driving circuit according to the present embodiment drives the MOS transistor 1 and the MOS transistor 2 provided in the DC/DC converter.

This DC/DC converter generates an output voltage Vout from an input voltage Vin, and provides it for a load. A control circuit 11 for example receives an output voltage Vout as a feedback signal, and generates a switching signals S and S for maintaining the output voltage at a predetermined value. The control system is, for example, the PWM or the PFM.

In this case, the switching signals S and S are pulse signals.

A driving circuit 12 directly relates to the present invention, and drives the MOS transistor 1 and the MOS transistor 2 according to the switching signals S and S. The driving circuit 12 comprises a MOS driving unit 13 for driving the MOS transistor 1 according to the switching signal S; and a MOS driving unit 14 for driving the MOS transistor 2 according to the switching signal S.

Figure 3:
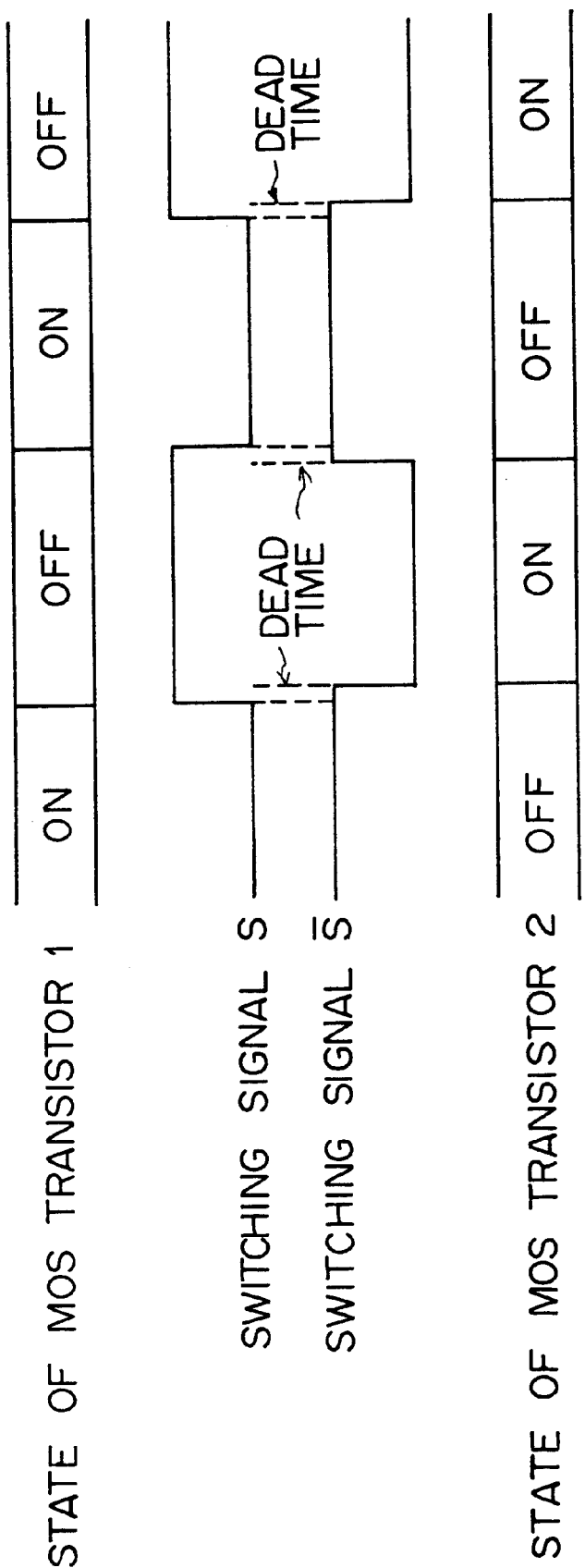
FIG. 3 shows an example of the switching signal provided for the driving circuit.

The switching signals S and S are basically pulse signals inverse to each other as shown in FIG. 3. When the MOS driving unit 13 receives an 'H' as a switching signal S, it sets the MOS transistor 1 in the OFF state. When it receives an 'L', it sets the MOS transistor 1 in the ON state. Similarly, when the MOS driving unit 14 receives an 'H' as a switching signal S, it sets the MOS transistor 2 in the OFF state. When it receives an 'L', it sets the MOS transistor 2 in the ON state.

The 'dead time' is assigned to the switching signals S and $\overline{S}$ not to set the MOS transistor 1 and the MOS transistor 2 simultaneously in the ON state. Using the dead time, the MOS transistor 2 is turned off immediately before the MOS transistor 1 is turned on. On the other hand, the MOS transistor 1 is turned off immediately before the MOS transistor 2 is turned on.

Figure 4:
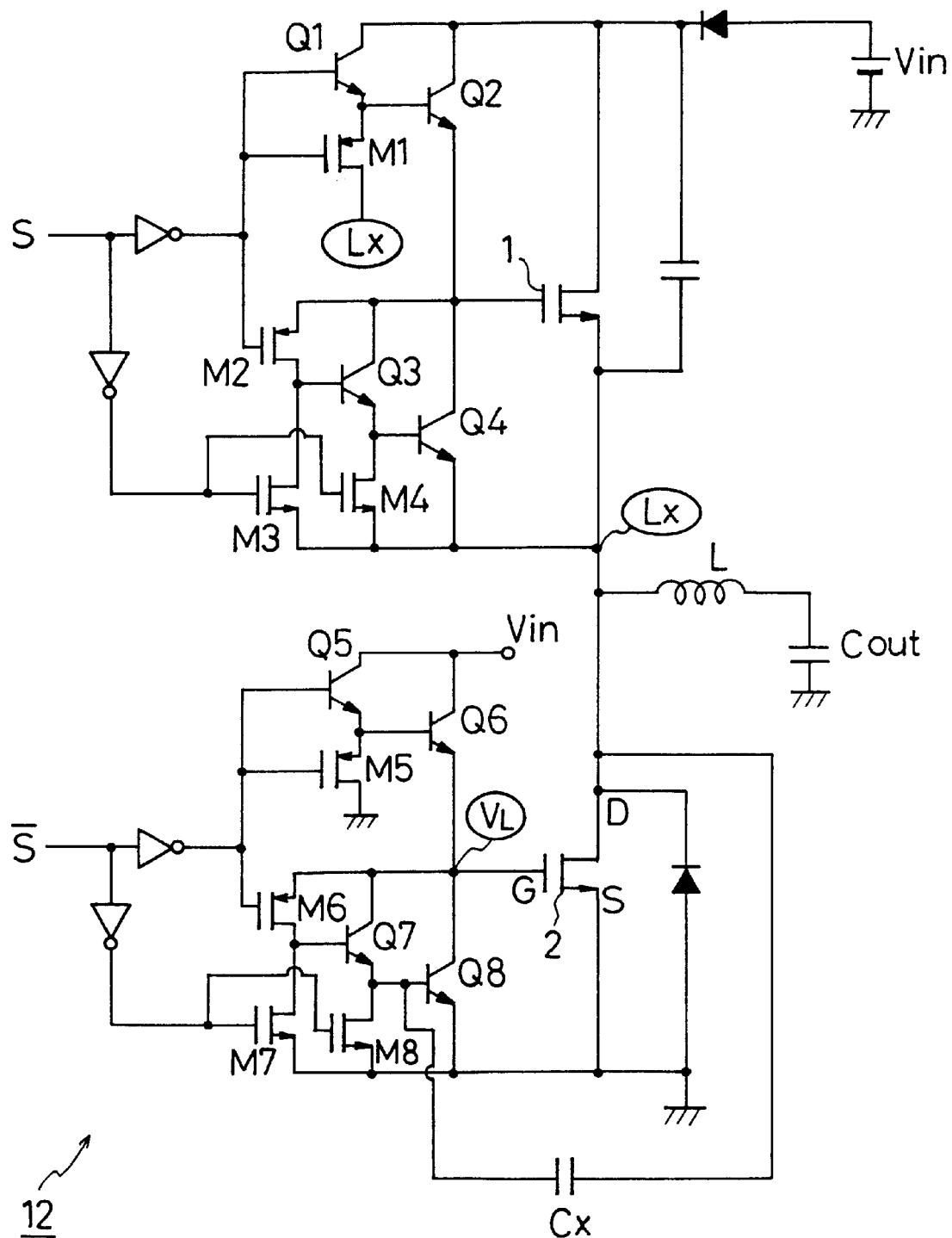
FIG. 4 shows the driving circuit according to the present embodiment of the present invention.

FIG. 4 shows the driving circuit according to the present embodiment. The driving circuit has the configuration in which a capacitor Cx is provided for the conventional driving circuit shown in FIG. 1. The capacitor Cx is provided between the point Lx, which is a connection point between the MOS transistor 1 and the MOS transistor 2, and the base of the transistor Q8 provided to remove an electric charge from the gate of the MOS transistor 2. The capacitance of the capacitor Cx depends on, for example, the input voltage Vin, the magnitude of the inductance connected to the MOS transistor 1 and the MOS transistor 2, the property of the transistor Q8, the property of the MOS transistor 2, etc.

The basic operation of the driving circuit according to the present embodiment has been described above by referring to FIG. 1. Therefore, only the function of the capacitor Cx is described below. The capacitor Cx is provided to avoid the erroneous turning-on of the MOS transistor 2 when the MOS transistor 1 is turned on or to reduce an undesired influence of the erroneous turning-on. Therefore, the operation of the driving circuit 12 performed when the MOS transistor 1 is turned on is described below.

When the MOS transistor 1 is turned on, the switching signal $\overline{S}$ has already indicated the H level as described above by referring to FIG. 3, and the MOS transistor 2 has entered the OFF state. In this state, when the switching signal S changes from the H level to the L level, an electric current is applied to the gate of the MOS transistor 1 through the transistor Q2, and the transistor Q4 enters the OFF state as described above by referring to FIG. 1. Therefore, the MOS transistor 1 is turned on. When the MOS transistor 1 is turned on, the electric potential at the point Lx rapidly rises.

As described above by referring to FIG. 1, when the electric potential rises at the point Lx, the electric potential of the gate of the MOS transistor 2 also rises by the influence of the parasitic capacitance (capacity) provided between the drain and the gate of the MOS transistor 2. Simultaneously, the electric potential of the base of the transistor Q8 rises by the capacitor Cx. Thus, the base current of the transistor Q8 flows and the transistor Q8 is turned on, thereby removing the electric charge from the gate of the MOS transistor 2. As a result, since the voltage between the gate and the source of the MOS transistor 2 is reduced, the MOS transistor 2 is not turned on. Otherwise, even if the MOS transistor 2 is turned on by the influence of the above described parasitic capacitance (capacity), the transistor Q8 is immediately turned on and removes an electric charge from the gate of the MOS transistor 2. As a result, the MOS transistor 2 returns to the OFF state within a very short time.

Thus, the driving circuit according to the present embodiment can avoid the erroneous turning-on of the MOS transistor 2 by providing the capacitor Cx. Even if an erroneous turning-on occurs, its influence can be successfully minimized.

When the transistor Q8 enters the ON state, it removes an electric charge from the gate of the MOS transistor 2. This is substantially equivalent to the control of the electric potential of the gate of the MOS transistor 2.

Figure 1:
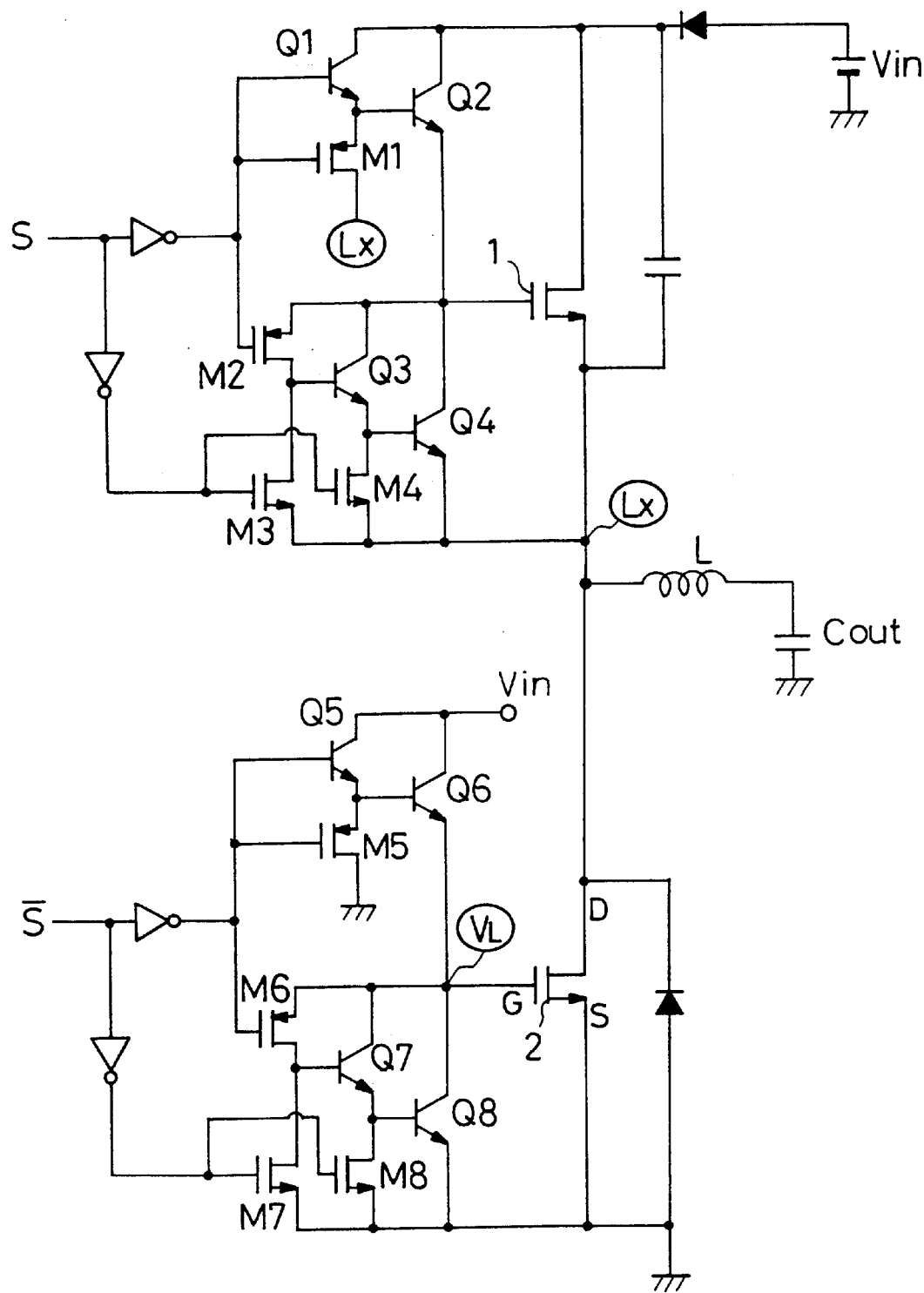
FIG. 1 shows the configuration of an application example of a set of interconnected switching elements and the driving circuit thereof.
Figures 5A, 5B:
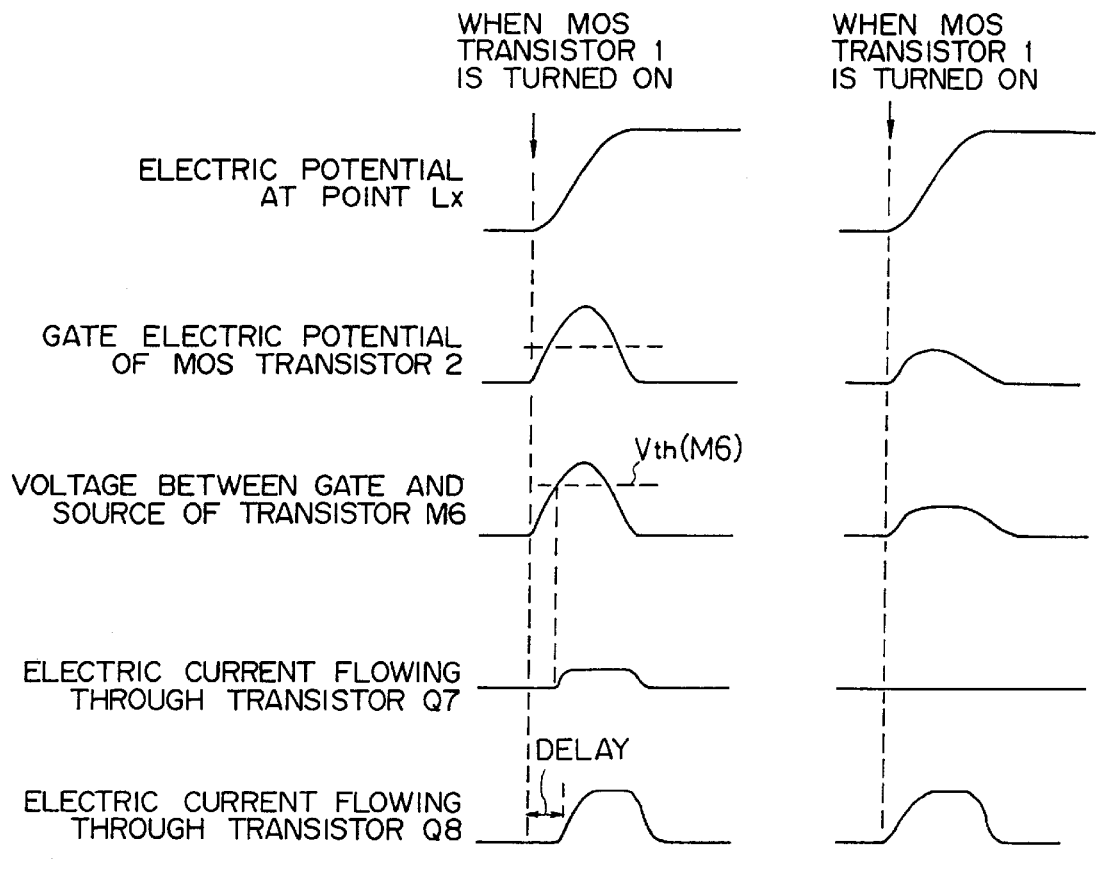
FIG. 5A shows the operation of the conventional driving circuit shown in FIG. 1.
FIG. 5B shows the operation of the driving circuit according to the present embodiment shown in FIG. 4.

FIGS. 5A and 5B show the effect of the present invention by comparing the configuration of the present invention with that of the conventional technology. The operation of the conventional driving circuit shown in FIG. 1 is shown in FIG. 5A, and the operation of the driving circuit according to the present embodiment shown in FIG. 4 is shown in FIG. 5B.

In the conventional driving circuit, after the MOS transistor 1 is turned on, the transistor M6 is turned on. Thereby, the transistor Q7 is turned on, and finally the transistor Q8 is turned on as described above by referring to FIG. 1. Thus, it is not a short time from when the MOS transistor 1 is turned on to when the transistor Q8 is turned on and the electric charge is removed from the gate of the MOS transistor 2. Therefore, a large electric current may flow through the MOS transistor 2 during the time.

On the other hand, in the driving circuit according to the present embodiment, when the MOS transistor 1 is turned on, the base current of the transistor Q8 immediately flows, and the transistor Q8 is turned on. As a result, it is a short time from when the MOS transistor 1 is turned on to when the electric charge is removed from the gate of the MOS transistor 2. During the time, no electric current flows through the MOS transistor 2, or only a small electric current flows through the MOS transistor 2. According to the present embodiment, the transistor Q8 may be turned on without turning on the transistor Q7 as shown in FIG. 5B.

According to the above described embodiment, a MOS transistor is used as a set of switching elements. However, the switching elements can be any other voltage driving elements such as an IGBT, etc., or can be current driving semiconductor elements.

Furthermore, according to the above described embodiment, a bipolar transistor is used as a unit for removing an electric charge from one control terminal of a set of switching elements. However, the present invention is not limited to this application. An equivalent effect can be obtained by any other circuits for removing an electric charge from the control terminal of the switching elements according to a signal input through a capacitor newly provided for the present invention.

Furthermore, according to the above described embodiment, a DC/DC converter is described as an embodiment. However, the present invention is not limited to this embodiment, but can be widely applied to a circuit for alternately driving a set of switching elements interconnected to each other.

Thus, according to the present invention, when a set of switching elements interconnected to each other are alternately driven, an erroneous turning-on of one switching element occurring when the other switching element is turned on can be successfully avoided, or the influence of the erroneous turning-on can be minimized. Therefore, the operations of the circuit connected to the set of the switching elements can be stabilized, and no overcurrent flows through the switching elements.

What is claimed is:

1. A driving circuit for driving first and second switching elements interconnected to each other, comprising:

electric charge removing means, connected to a control terminal of the first switching element, for removing an electric charge from the control terminal of the first switching element so as to turn off the first switching element according to a control signal; and a capacitor provided between said electric charge removing means and a connection point between the first and second switching elements, wherein said electric charge removing means removes an electric charge from the control terminal of the first switching element according to a signal input through said capacitor.

2. The circuit according to claim 1, wherein said electric charge removing means is a transistor; and said capacitor is connected to the control terminal of the transistor.

3. A driving circuit for driving first and second voltage driving switching elements interconnected to each other, comprising:

an electric potential control circuit, connected to a gate of the first switching element, for controlling gate electric potential of the first switching element so as to turn off the first switching element according to a control signal; and a capacitor provided between said electric potential control circuit and a connection point between the first and second switching elements, wherein said electric potential control circuit controls gate electric potential of the first switching element according to a signal input through said capacitor.

* * * * *

UNITED STATES PATENT AND TRADEMARK OFFICE
CERTIFICATE OF CORRECTION

PATENT NO. : 6,229,339 B1
DATED : May 8, 2001
INVENTOR(S) : Ohya et al.

It is certified that error appears in the above-identified patent and that said Letters Patent is hereby corrected as shown below:

<u>Column 1,</u>
Line 37, there should be a line over the $2^{nd}$ "S".
Line 66, there should be a line over the $2^{nd}$ "S".

<u>Column 3,</u>
Lines 17-18, there should not be a paragraph break.
Lines 61 and 64, there should be a line over the $2^{nd}$ "S".

<u>Column 4,</u>
Line 1, there should be a line over the $2^{nd}$ "S".
Lines 5 and 6, there should be a line over the $2^{nd}$ "S".
Line 12, there should be a line over the $2^{nd}$ "S".

Signed and Sealed this

Thirteenth Day of August, 2002

*Attest:*

*Attesting Officer*

JAMES E. ROGAN
*Director of the United States Patent and Trademark Office*